(12) United States Patent
Kumar et al.

(10) Patent No.: US 12,238,855 B2
(45) Date of Patent: Feb. 25, 2025

(54) GUARD TRACE GROUND VIA OPTIMIZATION FOR HIGH-SPEED SIGNALING

(71) Applicant: Dell Products L.P., Round Rock, TX (US)

(72) Inventors: Vijender Kumar, Bangalore (IN); Malikarjun Vasa, Secunderabad (IN); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/510,542

(22) Filed: Oct. 26, 2021

(65) Prior Publication Data
US 2023/0030534 A1    Feb. 2, 2023

(30) Foreign Application Priority Data
Jul. 28, 2021 (IN) .............................. 202111033960

(51) Int. Cl.
| H05K 1/02 | (2006.01) |
| H05K 1/11 | (2006.01) |
| H05K 1/18 | (2006.01) |

(52) U.S. Cl.
CPC ......... *H05K 1/0219* (2013.01); *H05K 1/0243* (2013.01); *H05K 1/0245* (2013.01); *H05K 1/111* (2013.01); *H05K 1/112* (2013.01); *H05K 1/18* (2013.01)

(58) Field of Classification Search
CPC ...... H05K 1/0219; H05K 1/0243; H05K 1/18; H05K 1/0245
See application file for complete search history.

(56) References Cited

U.S. PATENT DOCUMENTS

| 3,093,805 | A | * | 6/1963 | Osifchin | ................. | H01P 3/006 |
| | | | | | | 174/268 |
| 6,040,524 | A | * | 3/2000 | Kobayashi | ........... | H05K 1/0219 |
| | | | | | | 174/262 |
| 6,359,233 | B1 | * | 3/2002 | Joy | ........................ | H05K 3/242 |
| | | | | | | 361/779 |
| 6,812,411 | B2 | * | 11/2004 | Belau | .................... | H01R 12/523 |
| | | | | | | 174/260 |
| 7,145,411 | B1 | * | 12/2006 | Blair | ....................... | H01P 3/006 |
| | | | | | | 333/247 |
| 7,443,272 | B2 | * | 10/2008 | Jiang | ....................... | H01P 5/085 |
| | | | | | | 333/260 |
| 9,860,972 | B2 | * | 1/2018 | Kaikkonen | ............ | H05K 1/028 |
| 9,991,209 | B2 | | 6/2018 | Tan et al. | | |
| 10,779,402 | B1 | | 9/2020 | Ng et al. | | |

(Continued)

*Primary Examiner* — Ishwarbhai B Patel
(74) *Attorney, Agent, or Firm* — Larson Newman, LLP

(57) ABSTRACT

A printed circuit board (PCB) includes first and second signal pads and a guard trace formed on a surface of the PCB. The first and second signal pads are for connecting to signal contacts of a high-speed data communication interface. The guard trace is located between the first signal pad and the second signal pad. The PCB further includes first, second, and third ground vias that couple the guard trace to a ground plane of the PCB. The first ground via is located at a first end of the guard trace. The second ground via is located at a second end of the guard trace. The third ground via is located between the first via and the second via.

11 Claims, 4 Drawing Sheets

(56) References Cited

U.S. PATENT DOCUMENTS

| | | | |
|---|---|---|---|
| 2007/0221405 A1* | 9/2007 | Cheng | H05K 1/0219 |
| | | | 174/265 |
| 2009/0255720 A1* | 10/2009 | Lu | H05K 1/0253 |
| | | | 174/262 |
| 2016/0128191 A1* | 5/2016 | Fukuchi | G06F 30/3312 |
| | | | 174/258 |
| 2016/0293554 A1* | 10/2016 | Tan | H01L 23/49877 |
| 2017/0358878 A1* | 12/2017 | Smith, Jr. | H01R 12/7005 |

* cited by examiner

300

310

GUARD TRACE GROUND VIA OPTIMIZATION FOR HIGH-SPEED SIGNALING

FIELD OF DISCLOSURE

This disclosure generally relates to information handling systems, and more particularly relates to guard trace ground via optimization for high-speed signaling in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board (PCB) may include first and second signal pads and a guard trace formed on a surface of the PCB. The first and second signal pads may be for connecting to signal contacts of a high-speed data communication interface. The guard trace may be located between the first signal pad and the second signal void. The PCB may further include first, second, and third ground vias that couple the guard trace to a ground plane of the PCB. The first ground via may be located at a first end of the guard trace. The second ground via may be located at a second end of the guard trace. The third ground via may be located between the first via and the second via.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
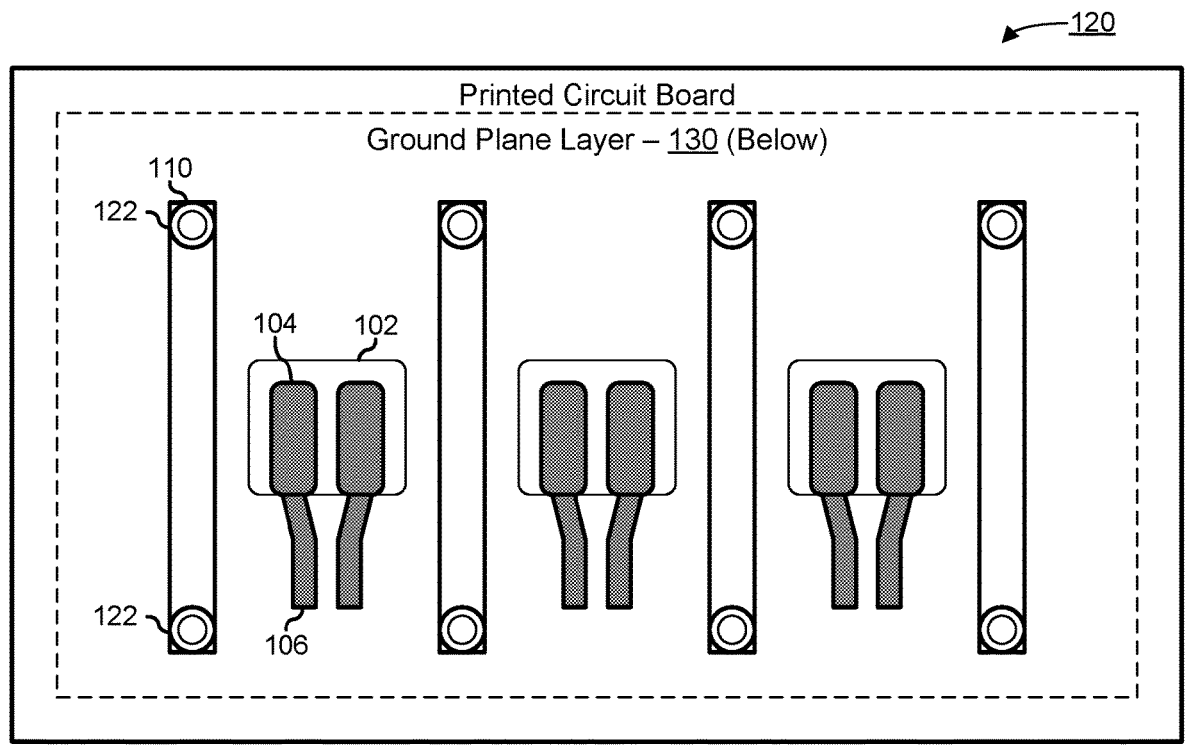
FIG. 1 illustrates printed circuit boards (PCBs) according to the prior art.
Figure 1:
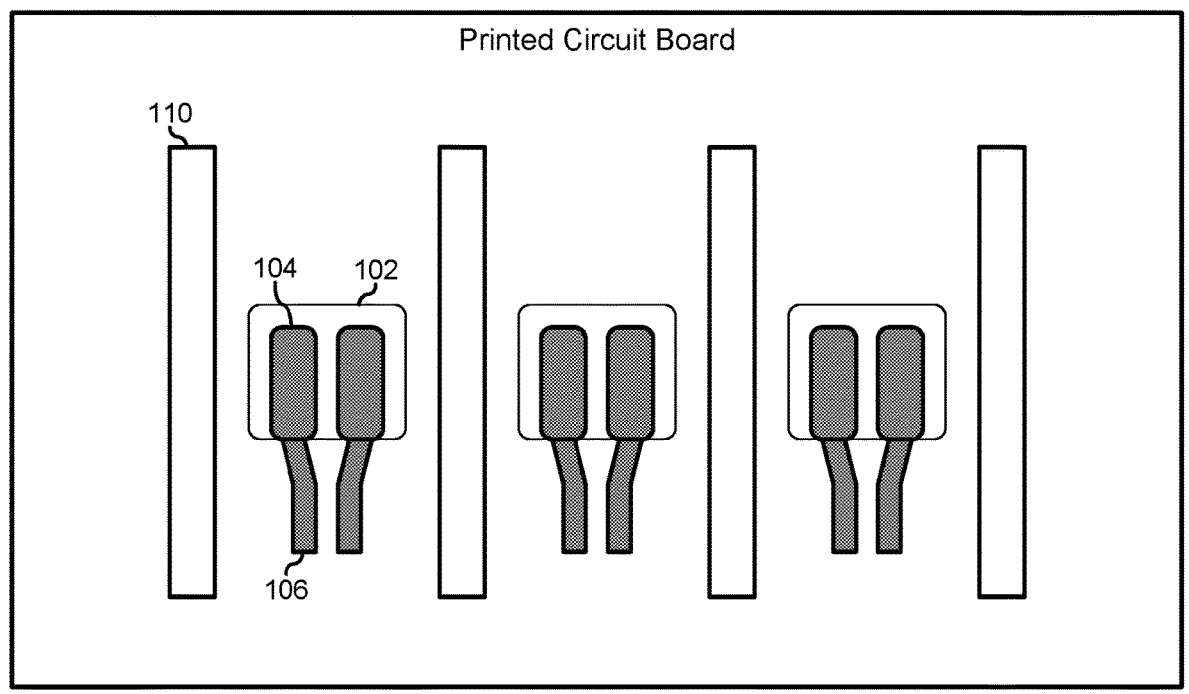

FIG. 1 illustrates printed circuit boards (PCBs) 100 and 120 according to the prior art. PCBs 100 and 120 represent circuit boards that provide a desired function for data processing, such as an information handling system. PCBs 100 and 120 provide circuit traces, and component pads and through-hole mounting locations for the components that provide the functions and features of the information handling system. As such, PCBs 100 and 120 will be understood to be fabricated as a multi-layer PCBs with various circuit traces formed on the front and back surfaces of the add-in card PCB, with various signal layers, power layers, and ground layers, and the like. The various circuit traces and layers may be formed of gold, nickel, tin, tin-lead, or other materials, as needed or desired. The circuit trace layers, ground layers, and power layers are sandwiched between insulating layers of PCB material which may include prepregnated fiberglass, Duroid, FR4, epoxy resin, or the like, as needed or desired. The circuit trace layers, ground layers, and power layers may include copper layers, aluminum layers, iron layers, or the like, as needed or desired. In an assembly process of the information handling system, various components are placed onto PCBs 100 and 120 in through-hole mounting locations, surface mounting locations, and the like, and in a solder reflow process, the connections of the components are electrically connected to the PCB. The details of PCB design and manufacturing, and electronic device assembly onto a PCB are known in the art, and will not be further described herein, except as needed to illustrate the current embodiments.

Among the various components that are assembled onto a PCB may include components that provide a high-speed data communication interface that is routed by the PCB between the components, or to connectors assembled onto the PCB to provide the high-speed data communication interface to other components, such as add-in cards, network connections, date connections, or other interfaces to components external to the PCB. Such high-speed data communication interfaces may be single-ended data communication interfaces, where data is transmitted over a single trace and data is communicated with reference to a reference voltage, typically a ground voltage level, or the high-speed data communication interface may be double-ended data communication interfaces, where data is transmitted over a pair of signal traces and data is communicated as a differential signal between the pair of traces. As the speed of high-speed data communication interfaces increases, and the typical distance between the traces decreases, the susceptibility of the high-speed data communication interfaces to cross-talk from other nearby signal sources also increases. An example of a high-speed data communication interface may include a PCI-Express (PCIe) interface such as a ×4, ×8, or ×16 PCIe interface, an Accelerated Graphics Port (AGP) interface, a Serial ATA interface, a network interface such as an Ethernet interface, a Fibre Channel interface, or the like, a proprietary interface, another high-speed interface, or the like.

PCB 100 includes surface mount voids 102 for mounting various surface mount components. Surface mount voids 102 include signal pads 104 for a double-ended differential signal high-speed data communication interface that are connected to other components via signal traces 106. Surface mount voids 102 are understood to be superior to through-hole mounting technologies, because the through-hole components may induce resonance into the high-speed data communication interface due to open circuit stubs created by excess connection lead material in the through-hole. Such open-circuit resonance may result in poor return loss characteristics in the connection made with through-hole technologies. Here, while surface mount voids 102 and signal pads 104 may result in improved return loss performance on the high-speed data communication interface, such surface mount voids and signal pads may increase the susceptibility of the high-speed data communication interface to crosstalk from adjacent signals. As such, PCB 100 includes guard traces 110 located between signal pads 104 that provide an inductive element between the signal pads to reduce the crosstalk between the sets of signal pads. It will be understood that guard traces similar to guard traces 110 may be provided to reduce crosstalk between the signal traces of single-ended high-speed data communication interfaces, as needed or desired. The length of guard traces 110 may be adjusted to conserve board real-estate, to minimize crosstalk between surface mount voids 102, to minimize crosstalk between signal traces 106, or in response to other design constraints, as needed or desired. For example, where signal pads are highly susceptible to crosstalk, but the associated signal traces are not as susceptible to crosstalk, then the associated guard traces may be relatively shorter, to reduce the crosstalk at the signal pad. However, where the signal traces are similarly susceptible to crosstalk, then the associated guard traces may be relatively longer to reduce the crosstalk in the signal traces.

PCB 120 is similar to PCB 100, including surface mount voids 102, signal pads 104, signal traces 106, and guard traces 110. However, here, guard traces 110 are connected to a ground plane layer 130 of PCB 120 via ground vias 122 fabricated into the PCB. The addition of ground vias 122 further improves the performance of the high-speed data communication interfaces by further reducing the susceptibility of surface mount voids 102 to crosstalk. Here, in addition to the inductive element that is guard trace 110, the inductance of the guard trace is increased to include the ground plane of PCB 120.

Figure 2:
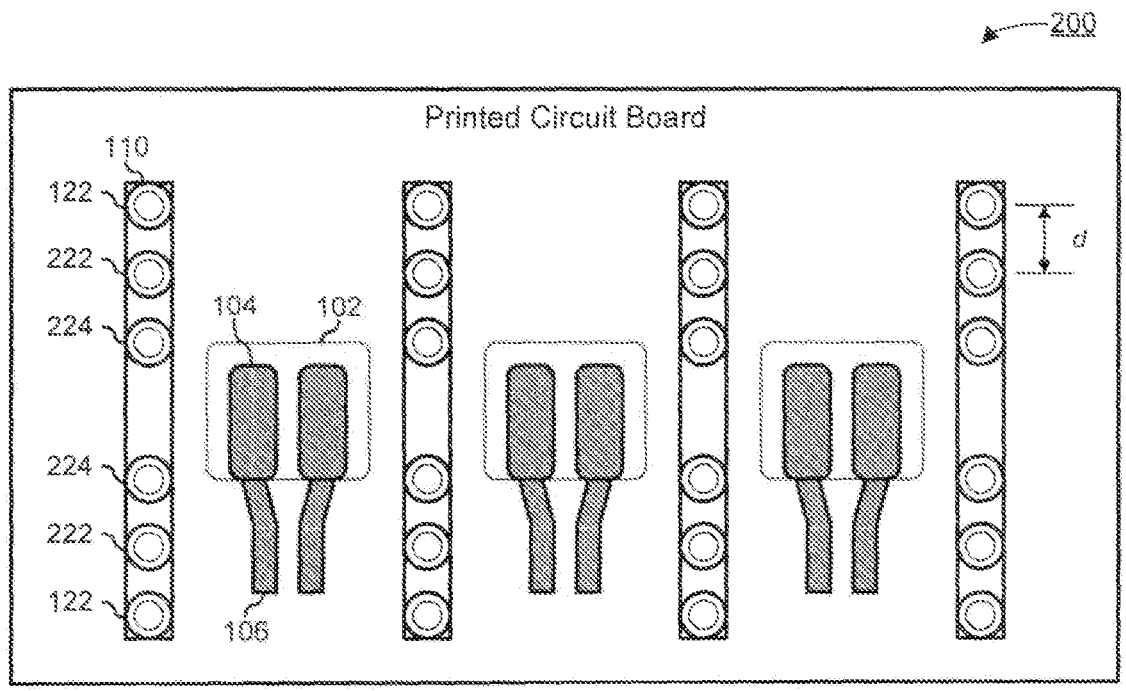
FIG. 2 illustrates a PCB according to an embodiment of the current disclosure.

FIG. 2 illustrates a PCB 200 according to an embodiment of the current disclosure. PCB 200 is similar to PCBs 100 and 120, including surface mount voids 102, signal pads 104, signal traces 106, and guard traces 110, and where the guard traces are connected to the a ground plane layer 230 of PCB 200 via ground vias 122 fabricated into the PCB. Here, guard traces 110 are connected to a ground plane layer of PCB 120 via ground vias 222 fabricated into the PCB which still further improves the performance of the high-speed data communication interfaces by further reducing the susceptibility of surface mount voids 102 to crosstalk. Here, ground vias 222 are located at a distance apart that is defined by:

$$d = \frac{2.95 \times 10^{12}}{\sqrt{\epsilon_R} \times f},$$ Equation 1 where d is the distance between the ground vias, $\epsilon_R$ is r\the dielectric constant of the insulating layer material of PCB 200, and f is the operating frequency of the high-speed data communication interface.

Figure 3:
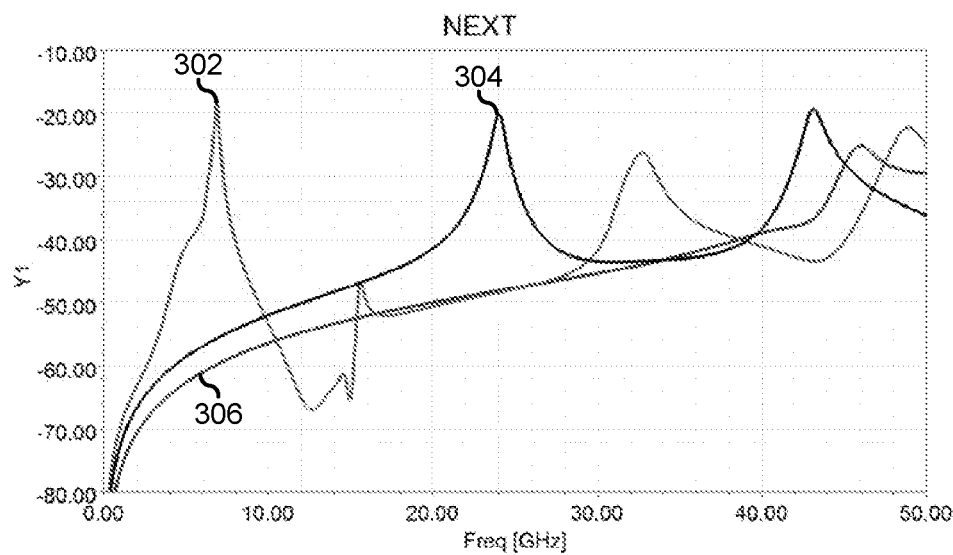
FIG. 3 illustrates an example of circuit performance with PCBs in accordance with FIG. 1, as compared with the circuit performance with a PCB in accordance with FIG. 2.
Figure 3:
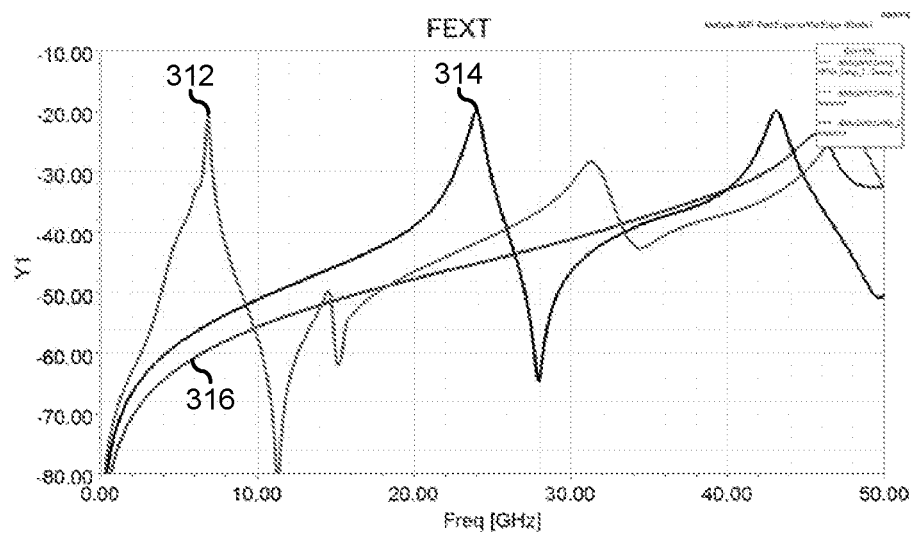

FIG. 3 is illustrates experimental result for circuit traces as measured by Near End Crosstalk (NEXT) 300 and by Far End Crosstalk (FEXT) 310. In the case of NEXT 300, a circuit pad with guard traces only is shown in trace 302, a circuit pad with guard traces and a single ground via on each end is shown in trace 304, and a circuit pad with guard traces and multiple ground vias is shown in trace 306. Here, in the particular case of PCIe connections, where the operating frequency is around 8 GHz, it can readily be seen that the case with multiple ground vias, as shown in trace 306, provides better NEXT performance. In the case of FEXT 310, a circuit pad with guard traces only is shown in trace 312, a circuit pad with guard traces and a single ground via on each end is shown in trace 314, and a circuit pad with guard traces and multiple ground vias is shown in trace 316. Again, where the PCIe operating frequency is around 8 GHz, it can readily be seen that the case with ground vias that are half within the body portion and half within the card edge portion, as shown in trace 316, provides better FEXT performance.

Figure 4:
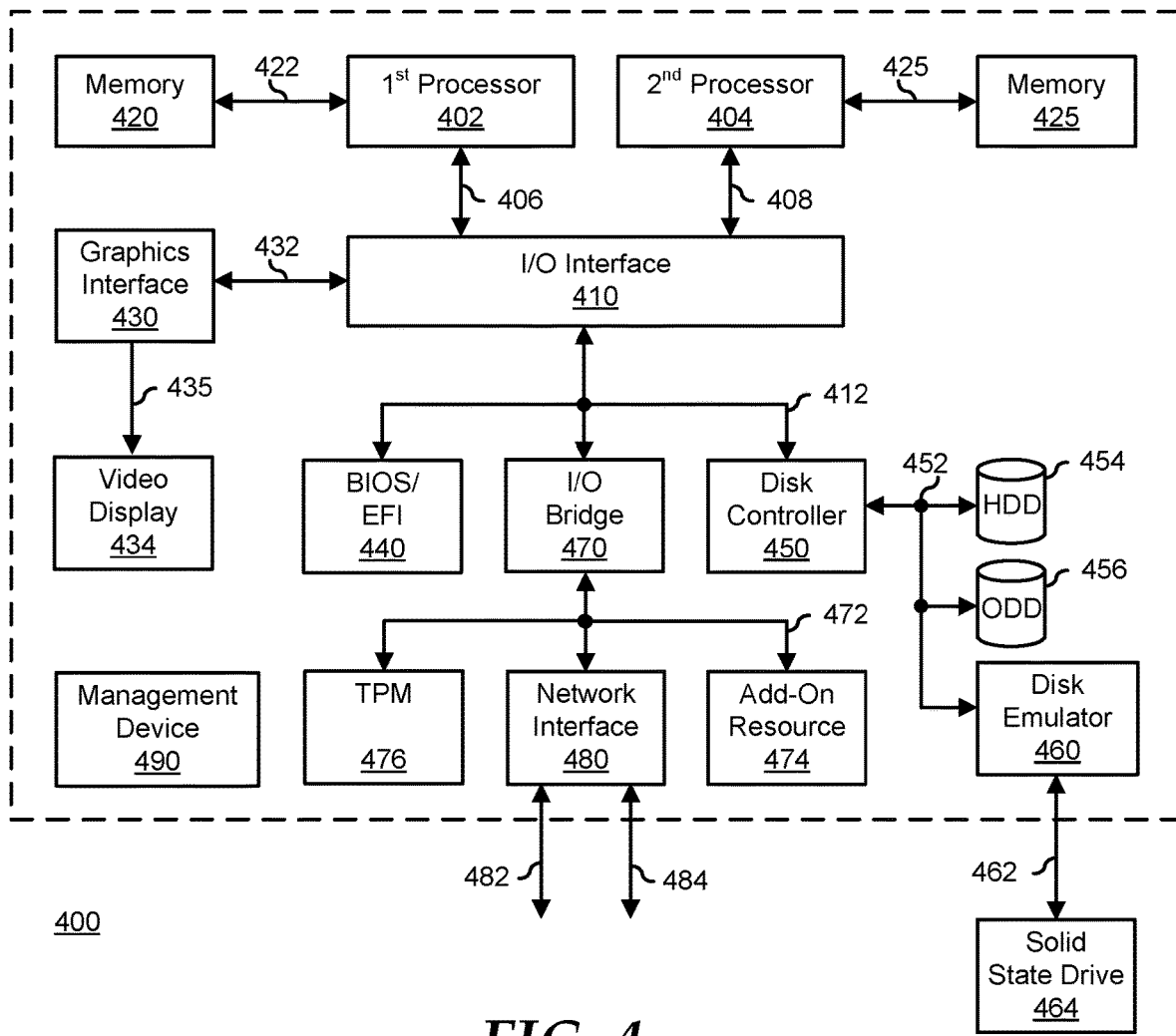
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, and a management device 490. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 435 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board (PCB), comprising:
   a first signal pad formed at a first surface mount void on a surface of the PCB, the first signal pad for connecting to a first signal contact of a differential signal high-speed data communication interface;
   a second signal pad formed at a second surface mount void on the surface of the PCB, the second signal pad for connecting to a second signal contact of the differential signal high-speed data communication interface;
   a guard trace formed on the surface of the PCB, the guard trace located between the first signal pad and the second signal pad;
   a first ground via that couples the guard trace to a ground plane of the PCB, the first ground via located at a first end of the guard trace;
   a second ground via that couples the guard trace to the ground plane of the PCB, the second ground via located at a second end of the guard trace;
   a third ground via that couples the guard trace to the ground plane of the PCB, the third ground via located between the first via and the second via; and
   a fourth ground via that couples the guard trace to the ground plane of the PCB, the fourth ground via located between the first via and the second via; wherein the guard trace is provided to decrease signal interference into the differential signal high-speed data communication interface;
   wherein the third ground via is located at a distance (d) from the first ground via, and the fourth ground via is located at the distance (d) from the second ground via wherein the distance (d) is given as:

$$d = \frac{2.95 \times 10^{12}}{\sqrt{\epsilon_R} \times f}$$

where ER is a dielectric constant of an insulating layer material of the PCB, and f is an operating frequency of the differential signal high-speed data communication interface; and wherein the signal interference is decreased at an operating frequency of the differential signal high-speed data communication interface.

2. The PCB of claim 1, wherein the differential signal high-speed data communication interface is a PCIe interface.

3. The PCB of claim 1, wherein the signal interference includes crosstalk.

4. The PCB of claim 1, wherein the plurality of contact fingers comprise one of gold contact fingers, nickel contact fingers, tin contact fingers, and tin-lead contact fingers.

5. The PCB of claim 1, wherein the ground plane layer comprises one of a copper layer, an aluminum layer, and an iron layer.

6. A method for forming a printed circuit board (PCB), the method comprising:
   forming, on a surface of the PCB, a first signal pad, the first signal pad for connecting to a first signal contact of a high-speed data communication interface;
   forming, on the surface of the PCB, a second signal pad, the second signal pad for connecting to a second signal contact of the high-speed data communication interface;
   forming a guard trace located between the first signal pad and the second signal pad;
   coupling, by a first ground via, the guard trace to a ground plane of the PCB, the first ground via located at a first end of the guard trace;
   coupling, by a second ground via, the guard trace to the ground plane of the PCB, the second ground via located at a second end of the guard trace;
   coupling, by a third ground via, the guard trace to the ground plane of the PCB, the third ground via located between the first via and the second via; and
   coupling, by a fourth ground via, the guard trace to the ground plane of the PCB, the fourth ground via located between the first via and the second via;
   wherein the guard trace is provided to decrease signal interference into the high-speed data communication interface;
   wherein the third ground via is located at a distance (d) from the first ground via, and the fourth ground via is located at the distance (d) from the second ground via wherein the distance (d) is given as:

$$d = \frac{2.95 \times 10^{12}}{\sqrt{\epsilon_R} \times f}$$

where ER is a dielectric constant of an insulating layer material of the PCB, and f is an operating frequency of the differential signal high-speed data communication interface.

7. The method of claim 6, wherein the high-speed data communication interface is a PCIe interface.

8. The method of claim 6, wherein the signal interference includes crosstalk.

9. The method of claim 6, wherein the signal interference is decreased at an operating frequency of the high-speed data communication interface.

10. The method of claim 6, wherein the plurality of contact fingers comprise one of gold contact fingers, nickel contact fingers, tin contact fingers, and tin-lead contact fingers.

11. An information handling system, comprising:
a component having a first signal contact for a differential signal high-speed data communication interface, and a second signal contact for the differential signal high-speed data communication interface; and
a printed circuit board (PCB), including:
a first signal pad formed at a first surface mount void on a surface of the PCB, the first signal pad for connecting to the first signal contact;
a second signal pad formed at a second surface mount void on the surface of the PCB, the second signal pad for connecting to the second signal contact;
a guard trace located between the first signal pad and the second signal pad;
a first ground via that couples the guard trace to a ground plane of the PCB, the first ground via located at a first end of the guard trace;
a second ground via that couples the guard trace to the ground plane of the PCB, the second ground via located at a second end of the guard trace;
a third ground via that couples the guard trace to the ground plane of the PCB, the third ground via located between the first via and the second via; and
a fourth ground via that couples the guard trace to the ground plane of the PCB, the fourth ground via located between the first via and the second via;
wherein the guard trace is provided to decrease signal interference into the differential signal high-speed data communication interface;
wherein the third ground via is located at a distance (d) from the first ground via, and the fourth ground via is located at the distance (d) from the second ground via wherein the distance (d) is given as:

$$d = \frac{2.95 \times 10^{12}}{\sqrt{\epsilon_R} \times f}$$

where $\epsilon_R$ is a dielectric constant of an insulating layer material of the PCB, and f is an operating frequency of the differential signal high-speed data communication interface; and
wherein the plurality of contact fingers comprise one of gold contact fingers, nickel contact fingers, tin contact fingers, and tin-lead contact fingers.

* * * * *